United States Patent
Mangal et al.

(10) Patent No.: US 9,620,200 B1
(45) Date of Patent: Apr. 11, 2017

(54) RETENTION VOLTAGES FOR INTEGRATED CIRCUITS

(71) Applicant: ARM Limited, Cambridge (GB)

(72) Inventors: Sanjay Mangal, Austin, TX (US); Gus Yeung, Austin, TX (US); Martin Jay Kinkade, Austin, TX (US); Rahul Mathur, Austin, TX (US); Bal S. Sandhu, Fremont, CA (US); George McNeil Lattimore, Austin, TX (US)

(73) Assignee: ARM Limited, Cambridge (GB)

( * ) Notice: Subject to any disclaimer, the term of this patent is extended or adjusted under 35 U.S.C. 154(b) by 0 days.

(21) Appl. No.: 15/081,869

(22) Filed: Mar. 26, 2016

(51) Int. Cl.
  *G11C 11/00* (2006.01)
  *G11C 11/419* (2006.01)
  *G11C 11/413* (2006.01)
  *G11C 11/412* (2006.01)
  *H01L 27/11* (2006.01)

(52) U.S. Cl.
  CPC .......... *G11C 11/419* (2013.01); *G11C 11/412* (2013.01); *G11C 11/413* (2013.01); *H01L 27/11* (2013.01); *H01L 27/1104* (2013.01)

(58) Field of Classification Search
  CPC ... G11C 11/419; G11C 11/412; G11C 11/413; H01L 27/11; H01L 27/1104
  USPC ....................................................... 365/154
  See application file for complete search history.

(56) References Cited

U.S. PATENT DOCUMENTS

| 5,644,546 | A | 7/1997 | Furumochi et al. |
| 7,183,825 | B2* | 2/2007 | Padhye .................. G11C 5/147 327/202 |
| 7,466,581 | B2 | 12/2008 | Huang et al. |
| 7,974,144 | B2 | 7/2011 | Clinton |

(Continued)

FOREIGN PATENT DOCUMENTS

TW 201344689 A 11/2013

OTHER PUBLICATIONS

Myers, et al.; A Subthreshold ARM Cortex-M0+ Subsystem in 65 nm CMOS for WSN Applications with 14 Power Domains, 10T SRAM, and Integrated Voltage Regulator; IEEE Journal of Solid-State Circuits; vol. 51, No. 1; Jan. 2016.

(Continued)

*Primary Examiner* — Pho M Luu
(74) *Attorney, Agent, or Firm* — Pramudji Law Group PLLC; Ari Pramudji

(57) ABSTRACT

Various implementations described herein may be directed to retention voltages for integrated circuits. In one implementation, an integrated circuit may include functional circuitry to store data bits, and may also include retention mode circuitry coupled to the functional circuitry to provide retention voltages to the functional circuitry, where the retention mode circuitry may include a first circuitry to provide a first retention voltage to the functional circuitry. The first circuitry may include a first diode device, and may include a first transistor device, a second diode device, or combinations thereof. The retention mode circuitry may also include a second circuitry to provide a second retention (Continued)

voltage to the functional circuitry, where the second circuitry includes second transistor devices. Further, the functional circuitry may be held in a data retention mode when the first retention voltage or the second retention voltage is provided to the functional circuitry.

20 Claims, 7 Drawing Sheets

(56) References Cited

U.S. PATENT DOCUMENTS

| | | | |
|---|---|---|---|
| 8,325,511 B2* | 12/2012 | Seshadri | G11C 11/417 365/154 |
| 8,355,293 B2* | 1/2013 | van Winkelhoff | G11C 11/413 365/189.09 |
| 8,885,393 B2 | 11/2014 | Bhatia et al. | |
| 9,110,643 B2* | 8/2015 | Idgunji | G06F 1/26 |
| 9,165,641 B2 | 10/2015 | Gulati et al. | |
| 9,385,713 B2* | 7/2016 | Uesugi | H01L 27/1207 |
| 2007/0252623 A1 | 11/2007 | Zampaglione et al. | |
| 2008/0055967 A1 | 3/2008 | Houston et al. | |
| 2008/0186794 A1 | 8/2008 | Clinton | |
| 2010/0109764 A1 | 5/2010 | Dathe et al. | |
| 2011/0309819 A1 | 12/2011 | Notani et al. | |
| 2012/0140585 A1 | 6/2012 | Van Winkelhoff et al. | |
| 2012/0182792 A1 | 7/2012 | Cheng et al. | |
| 2013/0003442 A1 | 1/2013 | Asthana | |
| 2014/0003181 A1 | 1/2014 | Wang et al. | |
| 2014/0036612 A1 | 2/2014 | Rai | |
| 2014/0140147 A1 | 5/2014 | Masleid | |
| 2015/0067361 A1 | 3/2015 | Rusu et al. | |
| 2015/0346743 A1 | 12/2015 | Bossu et al. | |
| 2016/0036439 A1 | 2/2016 | Douzaka | |

OTHER PUBLICATIONS

Dynamic Voltage Scaling; Wikipedia; Feb. 11, 2016 (accessed Mar. 25, 2016). https://en.wikipedia.org/wiki/Dynamic_voltage_scaling.

Current Mirror; Wikipedia; Feb. 10, 2016 (accessed Mar. 25, 2016). https://en.wikipedia.org/wiki/Current_mirror.

Chapter 11: The Current Mirror; Analog Devices Wiki; Jan. 9, 2014 (accessed Mar. 25, 2016). https://wiki.analog.com/university/courses/electronics/text/chapter-11.

Shi, et al.; Sleep Transistor Design and Implementation—Simple Concepts Yet Challenges to Be Optimum; 2006 International Symposium on VLSI Design, Automation and Test; Apr. 2006 http://blogs.synopsys.com/magicbluesmoke/files/2007/10/sleep_transistor_sizing.pdf.

* cited by examiner

RETENTION VOLTAGES FOR INTEGRATED CIRCUITS

BACKGROUND

This section is intended to provide information relevant to understanding various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

Integrated circuits (IC) may be formed from arrangements of one or more input/output devices, standard devices, memory devices, and/or the like. In one scenario, memory devices may include memory arrays arranged into memory cells and the associated circuitry to write data to the memory cells and read data from the memory cells. In particular, the memory cells of a memory array, such as a random access memory (RAM) array, may be organized into rows and columns. The logic latches within these individual memory cells may be used to store a data bit that is representative of a logical "1" or "0." These memory cells may also be interconnected by word-lines (WL) and pairs of complementary bit-lines (BL).

A retention voltage in an integrated circuit can be used to hold components of that integrated circuit in a data retention state. For example, a memory device may be powered down as much as possible, where a retention voltage applied to memory cells of the memory device may be reduced to a level at which information stored therein can be maintained, and where that retention voltage may be kept as low as possible to avoid power consumption through current leakage. Given that the power consumption of such a device can be logarithmic with the voltage applied, an integrated circuit may be configured to provide as low a retention voltage as possible to the memory device.

BRIEF DESCRIPTION OF THE DRAWINGS

Implementations of various techniques will hereafter be described herein with reference to the accompanying drawings. It should be understood, however that the accompanying drawings illustrate only various implementations described herein and are not meant to limit the scope of various technologies described herein.

DETAILED DESCRIPTION

Figure 1:
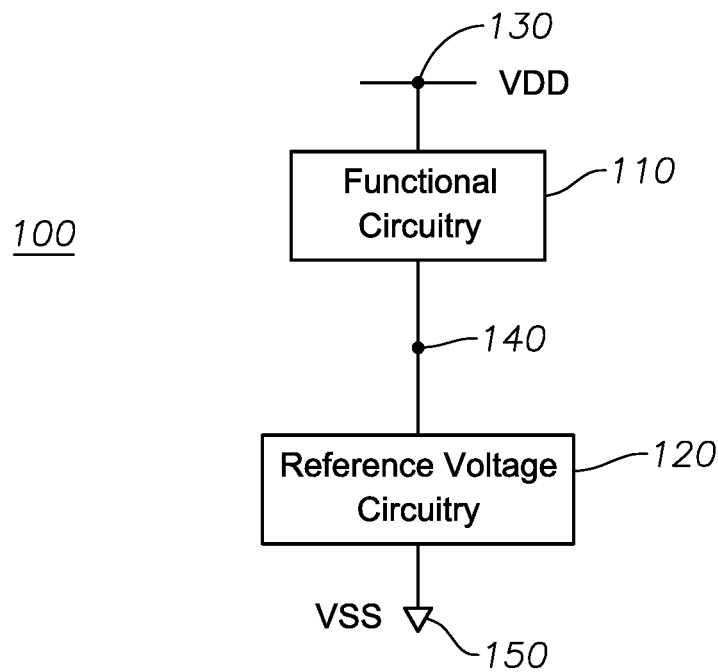
FIG. 1 illustrates a block diagram of an integrated circuit in accordance with various implementations described herein.

Various implementations described herein may refer to and may be directed to retention voltages for integrated circuits. For instance, in one implementation, an integrated circuit may include functional circuitry configured to store one or more data bits. The integrated circuit may also include retention mode circuitry coupled to the functional circuitry and configured to provide a plurality of retention voltages to the functional circuitry, where the retention mode circuitry may include a first circuitry configured to provide a first retention voltage to the functional circuitry. The first circuitry may include a first diode device, and may include a first transistor device, a second diode device, or combinations thereof. The retention mode circuitry may also include a second circuitry configured to provide a second retention voltage to the functional circuitry, where the second circuitry includes a plurality of second transistor devices. Further, the functional circuitry may be configured to be held in a data retention mode when the first retention voltage or the second retention voltage is provided to the functional circuitry.

Various implementations of using retention voltages for integrated circuits will now be described in more detail with reference to FIGS. 1-13.

As noted above, integrated circuits (IC) may be formed from arrangements of one or more input/output devices, standard devices, memory devices, and/or other devices. Input/output devices may be used to provide signals between the connection pins of the IC and the standard devices and memory devices arranged within the IC. Standard devices may be circuit implementations of flip-flops, arithmetic logic units, multiplexers, retention flops, balloon flops, latches, logic gates, and/or the like. Memory devices may include memory arrays arranged into memory cells and the associated circuitry to write data to the memory cells and read data from the memory cells. In particular, the memory array may include a plurality of individual memory cells, where the memory array may be organized in rows and columns. The array may have N rows and M columns, and, therefore, may have N×M individual memory cells. Each memory cell may be used to store a data bit that is representative of a logical "1" or "0".

The memory array may be any volatile memory array known to those skilled in the art, including various forms of a random-access memory (RAM) array, such as a static RAM (SRAM) array or a dynamic RAM (DRAM) array. In some implementations, the memory array may be implemented as a single port memory array, a dual port memory array, or any other such implementation known to those skilled in the art. In particular, the memory cells of the memory array may include different numbers of transistors, and may be referred to by the number of transistors. For example, for SRAM arrays, a cell having six transistors may be referred to as a six-transistor or 6-T cell, a cell having eight transistors may be referred to as an eight-transistor or 8-T cell, and/or the like. These transistors may form a data latch or flip-flop, which may be used to store the data bit that is representative of a logical "1" or "0".

As such, various types of functional circuitry may be used to store one or more data bits in an integrated circuit. Such functional circuitry may include a memory device, a retention latch, a retention flop, and/or any other implementation known to those in the art. Further, the various types of functional circuitry may operate in one or more modes of operation. The modes of operation may include an active mode, a data retention mode, and/or other modes of operation known in the art. In the active mode, the functional circuitry may be in a ready state and awaiting input. For example, in an active mode for a memory device, a power supply voltage may be applied across a memory array, such that the memory array may be fully operational for a read and/or write access to one or more memory cells of the array.

In the data retention mode, a retention voltage may be applied across the functional circuitry in order to hold components of the circuitry in a data retention state. In particular, the functional circuitry may be powered down as much as possible, where the retention voltage applied to the functional circuitry may be reduced to a level at which information stored therein can be maintained, and where that retention voltage may be kept as low as possible to avoid power consumption through current leakage. Given that the power consumption of the functional circuitry can be logarithmic with the voltage applied, an integrated circuit may be configured to provide as low a retention voltage as possible to the functional circuitry. However, applying a voltage that is below a minimum retention voltage may result in loss of data in the functional circuitry.

As such, in some scenarios, the integrated circuit may be configured to provide a higher retention voltage than needed to the functional circuitry. For example, a memory device may be designed to operate with a higher retention voltage early in the design process. However, due to factors such as process variation, changing operating voltage, process maturity, and/or the like, the memory device may be operable in the data retention mode at a lower retention voltage. In particular, the minimum retention voltage of the memory device may be lower than the designed-for retention voltage. Thus, the retention voltage applied to the memory device may be higher than necessary, which may lead to unnecessary current leakage. The increase in current leakage may ultimately lead to a reduction in the retention voltage supplied to the memory device, which may lead to an increase in data retention failures.

In view of the above, various implementations described herein may be used to produce one of a plurality of retention voltages for application to the functional circuitry. In one implementation, the lowest retention voltage of the plurality of retention voltages may be produced in order to minimize current leakage.

In one implementation, an integrated circuit may include functional circuitry and reference voltage circuitry, where the reference voltage circuitry may be used to produce various voltages across the functional circuitry. For example, FIG. 1 illustrates a block diagram of an integrated circuit 100 in accordance with various implementations described herein. As shown, the integrated circuit 100 may include functional circuitry 110 and reference voltage circuitry 120. As noted above, the functional circuitry 110 may be a memory device, a retention latch, a retention flop, and/or any other implementation known to those in the art. The memory device may include one or more memory arrays and associated input/output circuitry (e.g., word lines, bit lines, and/or the like). In one implementation, the functional circuitry 110 may be a memory device having one or more SRAM arrays. The functional circuitry 110 may be coupled to a positive supply voltage node 130 and a reference voltage node 140. The functional circuitry 110 may receive a power supply voltage at the positive supply voltage node 130 and a reference voltage at the reference voltage node 140. The power supply voltage provided via the positive supply voltage node 130 may hereinafter be referred to as $V_{DD}$. As shown, the voltage supplied to the functional circuitry 110 may be the difference between $V_{DD}$ and the reference voltage at the reference voltage node 140.

As is also shown, the reference voltage circuitry 120 may be coupled between the reference voltage node 140 and a negative supply voltage node 150. The reference voltage circuitry 120 may receive a negative supply voltage at the negative supply voltage node 150. The negative supply voltage provided via the negative supply voltage node 150 may hereinafter be referred to as $V_{SS}$. In one implementation, $V_{SS}$ may be a ground voltage.

As is further explained below, the reference voltage circuitry 120 may produce various reference voltages at the reference voltage node 140. In particular, the reference voltage produced at the node 140 may be based on the voltage drop produced across the reference voltage circuitry 120. For example, in one implementation, the voltage drop produced across the reference voltage circuitry 120 may be equal to zero or substantially close to zero. With no voltage drop, the reference voltage produced by the reference voltage circuitry 120 at the node 140 may then be substantially equal to $V_{SS}$.

In such an implementation, where the reference voltage is substantially equal to $V_{SS}$, the functional circuitry 110 may be placed in its active mode of operation. For example, a $V_{DD}$ normalized to 1 volt (V) may be supplied at node 130, and a $V_{SS}$ of 0 V (i.e., ground voltage) may be supplied at node 150. If the reference voltage circuitry 120 produces no voltage drop, then the reference voltage supplied at node 140 may be substantially equal to $V_{SS}$. As noted above, the voltage supplied to the functional circuitry 110 may be the difference between $V_{DD}$ and the reference voltage at the node 140. Thus, the voltage supplied to the functional circuitry 110 may then be equal to 1 V. Such a voltage may fully power the functional circuitry 110 and place the circuitry 110 in its active mode.

In another implementation, a voltage drop greater than zero may be produced across the reference voltage circuitry 120. In such an implementation, the reference voltage circuitry 120 may produce a reference voltage at the node 140 that is equal to a sum of $V_{SS}$ and the voltage drop.

In particular, where the reference voltage is substantially equal to a sum of $V_{SS}$ and a voltage drop greater than zero, the functional circuitry 110 may be placed in its data retention mode of operation. For example, a $V_{DD}$ normalized to 1 V may be supplied at node 130, and a $V_{SS}$ of 0 V (i.e., ground voltage) may be supplied at node 150. In addition, the voltage drop produced across the reference voltage circuitry 120 may be equal to 0.3 V. As such, the reference voltage circuitry 120 may produce a reference voltage at the node 140 that is equal to 0.3 V (i.e., the sum of $V_{SS}$ and the voltage drop). As noted above, the voltage supplied to the functional circuitry 110 may be the difference between $V_{DD}$ and the reference voltage at the node 140. Thus, the voltage supplied to the functional circuitry 110 may be equal to 0.7 V. Such a voltage may be sufficient to be a retention voltage, where the voltage is high enough for the functional circuitry 110 to maintain its stored data, placing the functional circuitry 110 in its data retention mode.

As is further explained below, the reference voltage circuitry 120 may be implemented using various circuitries in order to produce a plurality of reference voltages at the node 140. As noted above, these reference voltages may be used to place the functional circuitry 110 in an active mode or a data retention mode. Furthermore, the reference voltage circuitry 120 may be able to produce various reference voltages that may lead to different retention voltages being supplied to the functional circuitry 110. As noted above, in order to minimize current leakage, the reference voltage circuitry 120 may produce the reference voltage at node 140 that produces the lowest retention voltage for the functional circuitry.

In some memory device technologies where the values used for $V_{DD}$ have scaled down from 1.8 V, to 1.5 V, to 1.0 V, and lower, a memory cell of the device (e.g., a 6T cell) may have had a retention voltage that remained in the range of 0.6 V to 0.75 V. This may have been due to the leakage increasing as the $V_{DD}$ became lower, because the voltage scaling may not have worked as well as in older technologies. Other memory device technologies may have used values for $V_{DD}$ that ranged from 1.2 V to 0.8 V, but, again, a memory cell of the device (e.g., the 6T cell) may have had retention voltages that remained in the range of 0.6-0.7 V at worst case process and environmental conditions (such as temperature) in order to maintain yield.

For the implementations described herein, the $V_{DD}$ may be normalized to 1 V, and the retention voltage required to retain the state of the memory cells may be in the range of 0.6-0.7 V. However, in the implementations described herein, the retention voltage may also be pushed lower than this range of 0.6-0.7 V in order to reduce the power used in a system on a chip (SOC) that uses memory in very low power applications. In particular, these implementations may lower the retention voltages down to 0.2-0.4 V, depending on the very low power applications being used. The operation of Near Threshold memories is discussed in IEEE Journal of Solid-State Circuits, Vol. 31, No. 1, January 2016, by James Myers, et. Al. "A Subthreshold ARM Cortex-M0+ subsystem in 65 nm CMOS for WSN Applications with 14 Power Domains, 10T SRAM, and Integrated Voltage Regulator." Further, these implementations may allow for a lower voltage to be maintained across the memory cell when a combination of new designs and/or compatible environmental conditions will support very low retention voltages, while also allowing for a dynamically switch to higher voltages across the memory cell if the SOC control determines that conditions have changed which no longer support low voltage retention and the retention voltage across the memory cell must be increased accordingly.

Returning to FIG. 1, in one implementation, the reference voltage circuitry 120 may include active mode circuitry that is configured to produce a reference voltage at the node 140 which places the functional circuitry 110 in the active mode, and may include retention mode circuitry that is configured to produce a reference voltage at the node 140 which places the functional circuitry 110 in the data retention mode.

Figure 2:
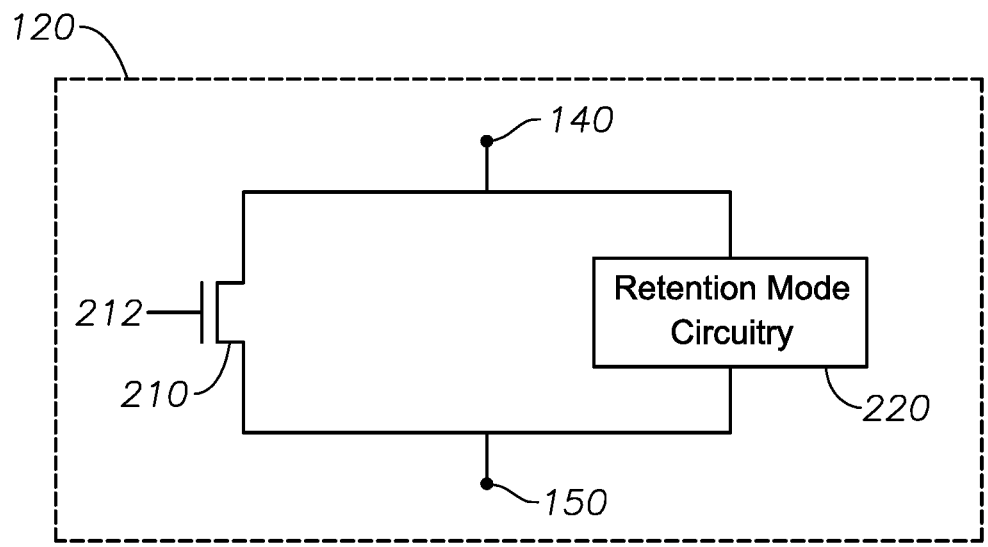
FIG. 2 illustrates a diagram of a reference voltage circuitry in accordance with various implementations described herein.

For example, FIG. 2 illustrates a diagram of the reference voltage circuitry 120 in accordance with various implementations described herein. As shown, the reference voltage circuitry 120 may include a plurality of legs coupled in parallel. In one implementation, however, only one leg may be enabled at a time. Each leg may have one end coupled to reference voltage node 140 and another end coupled to the negative supply voltage node 150 (i.e., $V_{SS}$).

One leg may include active mode circuitry 210. When the first leg is enabled, the active mode circuitry 210 may produce a reference voltage at the reference voltage node 140 that is substantially equal to $V_{SS}$, which may place the functional circuitry 110 in its active mode of operation, as discussed above. As shown in FIG. 2, the active mode circuitry 210 may be a switch. In particular, the active mode circuitry 210 may be in the form of an n-type transistor device, such as an NMOS transistor. When the NMOS transistor 210 receives a high enable signal 212, the NMOS transistor may turn on and allow the reference voltage at the node 140 to be substantially equal to $V_{SS}$.

One or more other legs of the reference voltage circuitry 120 may include retention mode circuitry 220. Various implementations of the retention mode circuitry 220 may be used, and are further described below.

Figure 3:
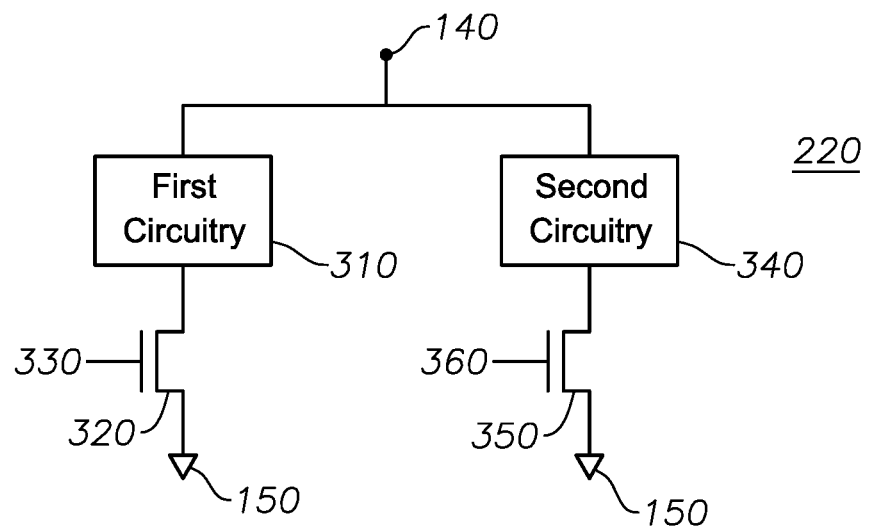
FIG. 3 illustrates a diagram of a retention mode circuitry in accordance with various implementations described herein.

FIG. 3 illustrates a diagram of the retention mode circuitry 220 in accordance with various implementations described herein. As shown, the circuitry 220 may include a first leg having a first circuitry 310 and a second leg having a second circuitry 340, where the first circuitry 310 is configured to produce a larger voltage drop than the second circuitry 340. As such, the first circuitry 310 may produce a larger reference voltage at the node 140 than the second circuitry 340. Accordingly, the larger reference voltage produced by the first circuitry 310 may lead to a lower retention voltage supplied to the functional circuitry 110. Conversely, the smaller reference voltage produced by the second circuitry 340 may lead to a higher retention voltage supplied to the functional circuitry 110.

As noted above, only one leg of the retention mode circuitry 220 may be enabled at a time, and each leg may have one end coupled to reference voltage node 140 and another end coupled to the negative supply voltage node 150 (i.e., $V_{SS}$). The first leg may be enabled by a switch 320 and enable signal 330, and the second leg may be enabled by a switch 350 and enable signal 360. The switches 320, 350 and enable signals 330, 360 may function similarly to the switch and enable signal of the active mode circuitry 210, described above. For example, switches 320, 350 may be NMOS transistors.

In one implementation, the first circuitry 310 may include a diode device, where the diode device is coupled to another diode device and/or a transistor device. In one implementation, the diode devices of the first circuitry 310 may be p-type or n-type transistors configured as diodes, where their gates are coupled to their drains. For example, the diode devices may be PMOS or NMOS transistors configured as diodes (hereinafter referred to as PMOS diodes and NMOS diodes, respectively). The transistor device of the first circuitry 310 may be a p-type or an n-type transistor device, such as a PMOS transistor or an NMOS transistor. The devices of the first circuitry 310 may be coupled in series and/or in parallel, as further explained below. In a further implementation, the second circuitry 340 may include two or more transistor devices, but no diode devices. The transistor devices may be p-type or n-type transistor devices, such as PMOS transistors or NMOS transistors. The devices of the second circuitry 340 may be coupled in series and/or in parallel, as further explained below. As is known to those skilled in the art, in order to couple the devices in series and/or in parallel, a source terminal and/or a drain terminal of a device may be coupled to a source terminal and/or a drain terminal of another device.

In such an implementation, the devices of the first circuitry 310 may produce a larger voltage drop than the devices of the second circuitry 340. Accordingly, the first circuitry 310 may produce a larger reference voltage at the node 140 than the second circuitry 340. For example, if a $V_{DD}$ normalized to 1 V is supplied at node 130, the first circuitry 310 may produce a reference voltage of 0.6-0.8 V at the node 140, which may result in a retention voltage of 0.2-0.4 V being supplied to the functional circuitry 110. In contrast, if a $V_{DD}$ of 0.85-0.9 V is supplied at node 130, the second circuitry 340 may produce a reference voltage of 0.1-0.3 V at the node 140, which may produce a retention voltage of 0.6-0.8 V, particularly if $V_{DD}$ is 0.9 V. In some implementations, the SOC may change its operating $V_{DD}$ during different modes of operation, and the retention voltage generation needs to be able to respond to these differences in VDD dynamically. In particular, the first circuitry 310 (i.e., the first leg) may be enabled in order for a lower voltage to be maintained across the functional circuitry 110 when compatible environmental conditions will support low retention voltages. Conversely, the second circuitry 340 (i.e., the second leg) may be enabled for higher voltages to be applied across the functional circuitry 110 if the SOC control determines that conditions have changed which no longer support low voltage retention and the retention voltage across the functional circuitry 110 must be increased accordingly. Switching between (i.e., the enabling of) the first circuitry 310 or the second circuitry 340 may occur dynamically in response to changes in power and/or one or more environmental conditions (e.g., temperature).

Figure 4:
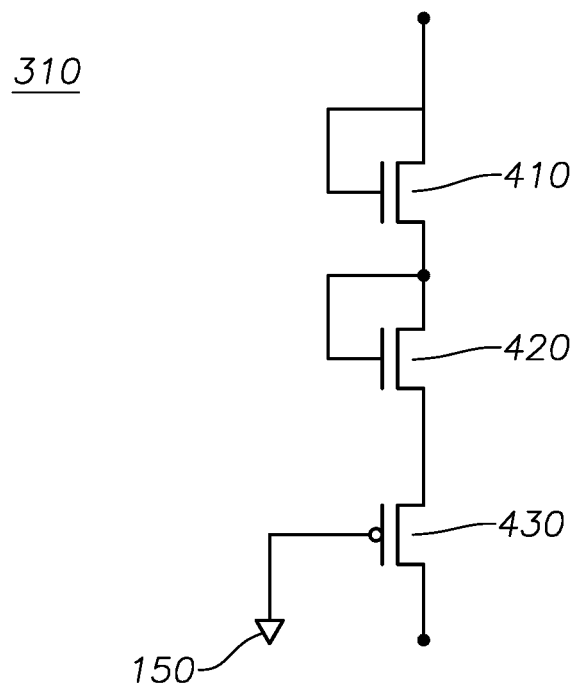
FIGS. 4-6 illustrate diagrams of a first circuitry in accordance with various implementations described herein.

Various implementations may be used for the first circuitry 310, where the first circuitry 310 includes a diode device that is coupled to another diode device and/or a transistor device. For example, FIG. 4 illustrates a diagram of the first circuitry 310 in accordance with various implementations described herein. As shown in FIG. 4, the first circuitry 310 may include a first NMOS diode 410, a second NMOS diode 420, and a PMOS transistor 430 coupled in series. The gate of the PMOS transistor 430 may be coupled to the negative voltage supply node 150. In the example shown in FIG. 4, a source terminal of the first NMOS diode 410 is coupled to a drain terminal of the second NMOS diode 420, and a source terminal of the second NMOS diode 420 is coupled to a source terminal of the PMOS transistor 430, though other configurations for coupling the devices in series may be used instead. This example of the first circuitry 310 may be inserted into the first leg of the retention mode circuitry 220, where the circuitry 310 may be placed in series with the switch 320.

Figure 5:
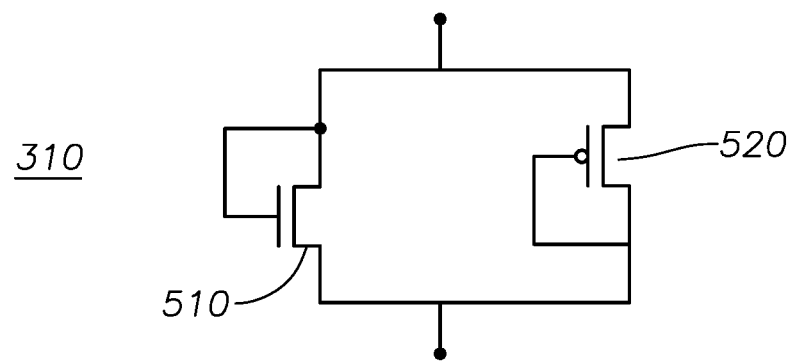

In another example, FIG. 5 illustrates a diagram of the first circuitry 310 in accordance with various implementations described herein. As shown in FIG. 4, the first circuitry 310 may include an NMOS diode 510 coupled in parallel with a PMOS diode 520. In particular, a drain terminal of the NMOS diode 510 may be coupled to a source terminal of the PMOS diode 520, and a source terminal of the NMOS diode 510 may be coupled to a drain terminal of the PMOS diode 520. This example of the first circuitry 310 may be inserted into the first leg of the retention mode circuitry 220, where the circuitry 310 may be placed in series with the switch 320. Further operation and implementations of an NMOS diode coupled in parallel with a PMOS diode is further described in commonly-assigned U.S. Pat. No. 8,355,293, the entire disclosure of which is herein incorporated by reference.

Figure 6:
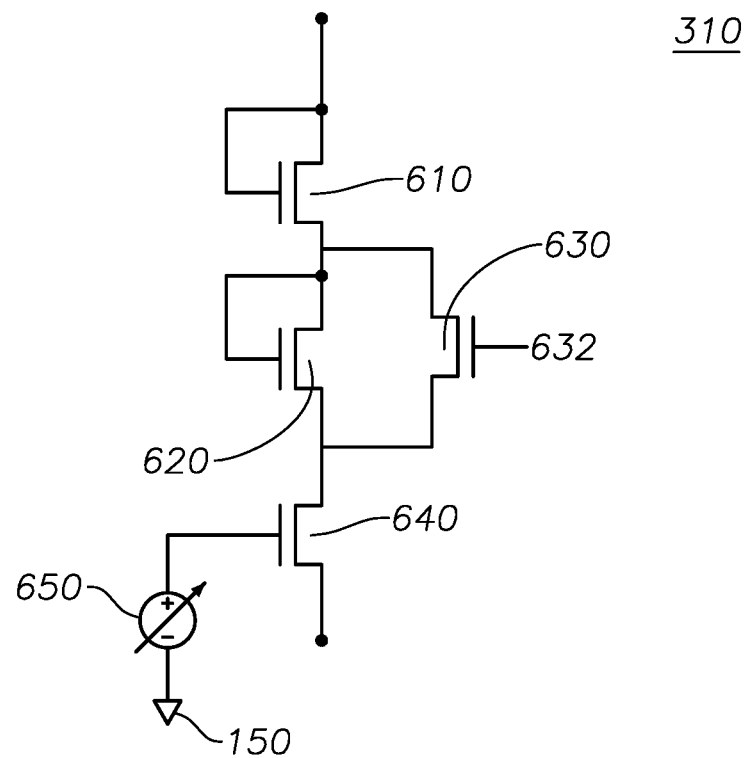

In another example, FIG. 6 illustrates a diagram of the first circuitry 310 in accordance with various implementations described herein. As shown in FIG. 6, the first circuitry 310 may include a first NMOS diode 610, a second NMOS diode 620, and an NMOS transistor 640 coupled in series. In the example shown in FIG. 6, a source terminal of the first NMOS diode 610 is coupled to a drain terminal of the second NMOS diode 620, and a source terminal of the second NMOS diode 620 is coupled to a drain terminal of the NMOS transistor 640, though other configurations for coupling the devices in series may be used instead.

As shown, the second NMOS diode 620 may be bypassed by a switch 630, where the switch 630 may be in the form of an NMOS transistor. When the switch 630 receives a high enable signal 632, the switch 630 may turn on, thereby bypassing the second NMOS diode 620. In one implementation, the voltage drop across the first circuitry 310 may decrease with the switch 630 enabled.

Further, the gate of the NMOS transistor 640 may receive a controllable voltage 650, where the controllable voltage 650 may be varied. By varying the voltage 650, the impedance of the NMOS transistor 640 may be varied, thereby controlling the voltage drop across the NMOS transistor 640 and, thus, the voltage drop across the first circuitry 310. The controllable voltage 650 may be controlled by a voltage regulator and/or any other implementations known to those skilled in the art.

In addition, this example of the first circuitry 310 may be inserted into the first leg of the retention mode circuitry 220, where the circuitry 310 may be placed in series with the switch 320. However, with the controllable voltage 650, in some implementations, the switch 320 may become optional, and, instead, the controllable voltage 650 received by the NMOS transistor 640 may be used to enable the first leg of the circuitry 220. In another implementation, the second NMOS diode 620 and the switch 630 may be optional, such that the first circuitry 310 may include the first NMOS diode 610 and the NMOS transistor 640 coupled in series.

Figure 7:
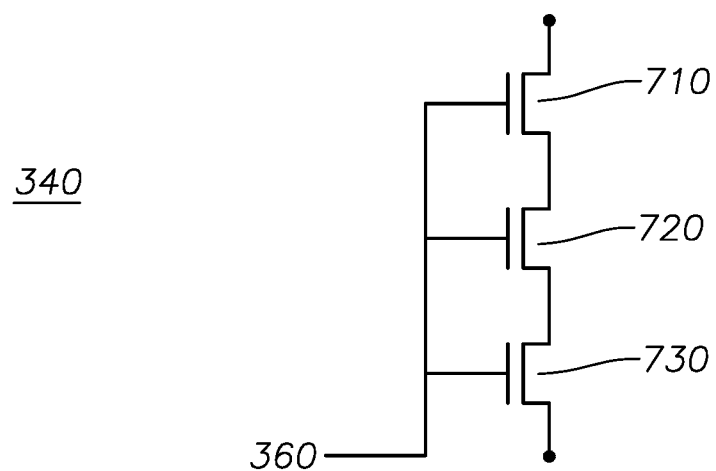
FIG. 7 illustrates a diagram of a second circuitry in accordance with various implementations described herein.

Various implementations may be used for a second circuitry 340 having two or more transistor devices, but no diode devices. For example, FIG. 7 illustrates a diagram of the second circuitry 340 in accordance with various implementations described herein. As shown in FIG. 7, the second circuitry 340 may include three NMOS transistors 710, 720, and 730 coupled in series. In particular, a source terminal of the NMOS transistor 710 may be coupled to a drain terminal of the NMOS transistor 720, and a source terminal of the NMOS transistor 720 may be coupled to a drain terminal of the NMOS transistor 730. This example of the second circuitry 340 may be inserted into the second leg of the retention mode circuitry 220, and the NMOS transistors 710, 720, and 730 may be enabled using the same signal 360 that enables the switch 350, as shown in FIG. 3.

In these examples, the first circuitry 310 may produce a larger reference voltage at the node 140 than the second circuitry 340. Accordingly, as explained above, the larger reference voltage produced by the first circuitry 310 may lead to a lower retention voltage supplied to the functional circuitry 110, and the smaller reference voltage produced by the second circuitry 340 may lead to a higher retention voltage supplied to the functional circuitry 110.

Figure 8:
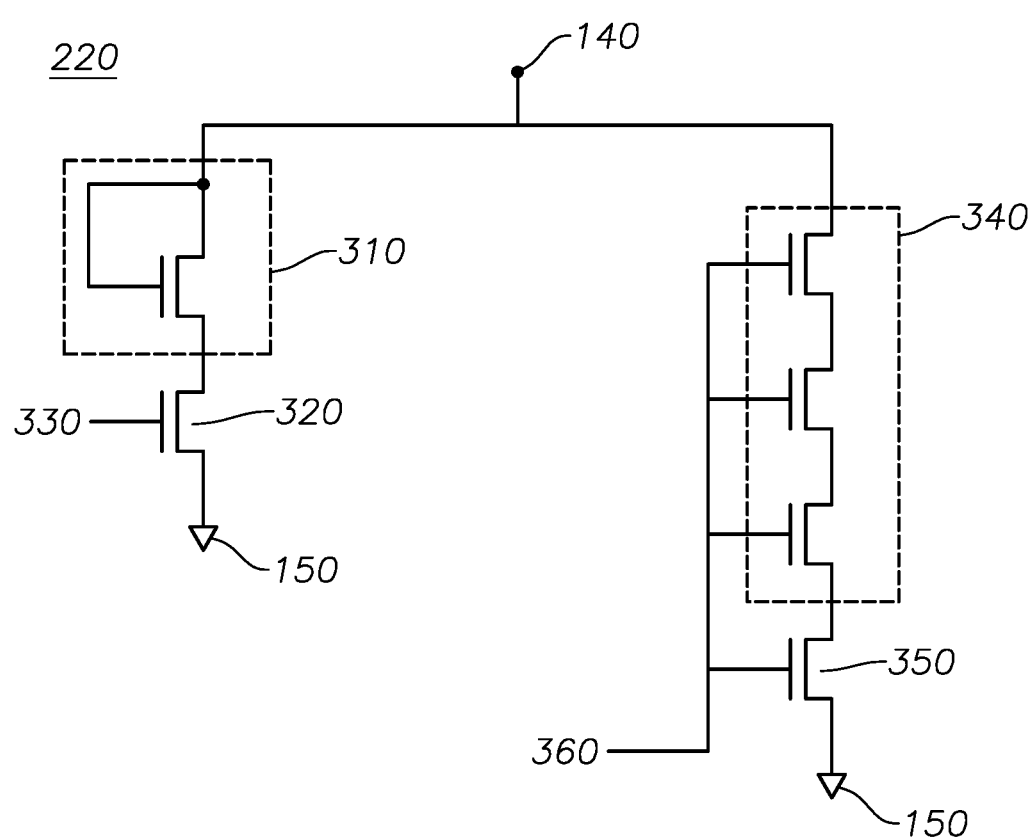
FIG. 8 illustrates a diagram of the retention mode circuitry in accordance with various implementations described herein.

Returning to FIG. 3, in one implementation, the retention mode circuitry 220 may include a first circuitry 310 having a single diode device, and a second circuitry 340 having two or more transistor devices. The diode device and the transistor devices may be similar to those discussed above. For example, FIG. 8 illustrates a diagram of the retention mode circuitry 220 in accordance with various implementations described herein. As shown, the first circuitry 310 may include an NMOS diode coupled in series with the switch 320. As also shown, the second circuitry 340 may include three NMOS transistors coupled in series with the switch 350, where the signal 360 enables all of the NMOS transistors. In such an implementation, the first circuitry 310 may produce a larger reference voltage at the node 140 than the second circuitry 340. Accordingly, the larger reference voltage produced by the first circuitry 310 may lead to a lower retention voltage supplied to the functional circuitry 110, and the smaller reference voltage produced by the second circuitry 340 may lead to a higher retention voltage supplied to the functional circuitry 110.

Returning to FIG. 1, in another implementation, the reference voltage circuitry 120 may include at least one transistor device having a gate configured to receive a controllable voltage, where the controllable voltage applied to the gate may be varied. The transistor device may be a p-type or n-type transistor device, such as a PMOS transistor or an NMOS transistor. In such an implementation, and similar to the implementation of FIG. 6 above, the controllable voltage may be controlled by a voltage regulator, a voltage-controlled current source, and/or any other implementation known to those skilled in the art.

As also noted above, by varying the controllable voltage received at the gate of the transistor device, the impedance of the transistor device may be varied. By varying the impedance of the transistor device, the voltage drop across the transistor device may be varied. In one scenario, the controllable voltage may be varied such that the transistor device has relatively low impedance, thereby allowing zero or a substantially small amount of voltage drop to be produced across the transistor device. In another scenario, the controllable voltage may be varied such that the transistor device has relatively high impedance, thereby producing a larger voltage drop across the transistor device.

As also noted above, the reference voltage produced at the node 140 may be based on the voltage drop produced across the reference voltage circuitry 120. It then follows that, by varying the impedance of the transistor device via the controllable voltage, the reference voltage at the node 140 may be controlled. As also discussed above, these reference voltages may lead to different retention voltages being supplied to the functional circuitry 110, and further may affect whether the functional circuitry 110 is placed in an active mode or a data retention mode. A larger reference voltage produced by the reference voltage circuitry 120 may lead to a lower retention voltage supplied to the functional circuitry 110. Conversely, a smaller reference voltage produced by the reference voltage circuitry 120 may lead to a higher retention voltage supplied to the functional circuitry 110. Accordingly, it can be said that the controllable voltage applied to the gate of the at least one transistor device may affect the retention voltage supplied to the functional circuitry 110, and may also affect whether the functional circuitry 110 is in an active mode or a data retention mode. As such, in one implementation, the controllable voltage applied to the gate may be varied in order to dynamically change the retention voltage supplied to the functional circuitry based on changes in power and/or environmental conditions (e.g., temperature).

As further described below, various implementations of the reference voltage circuitry 120 may be used, where the reference voltage circuitry 120 includes at least one transistor device with a gate configured to receive a controllable voltage.

Figure 9:
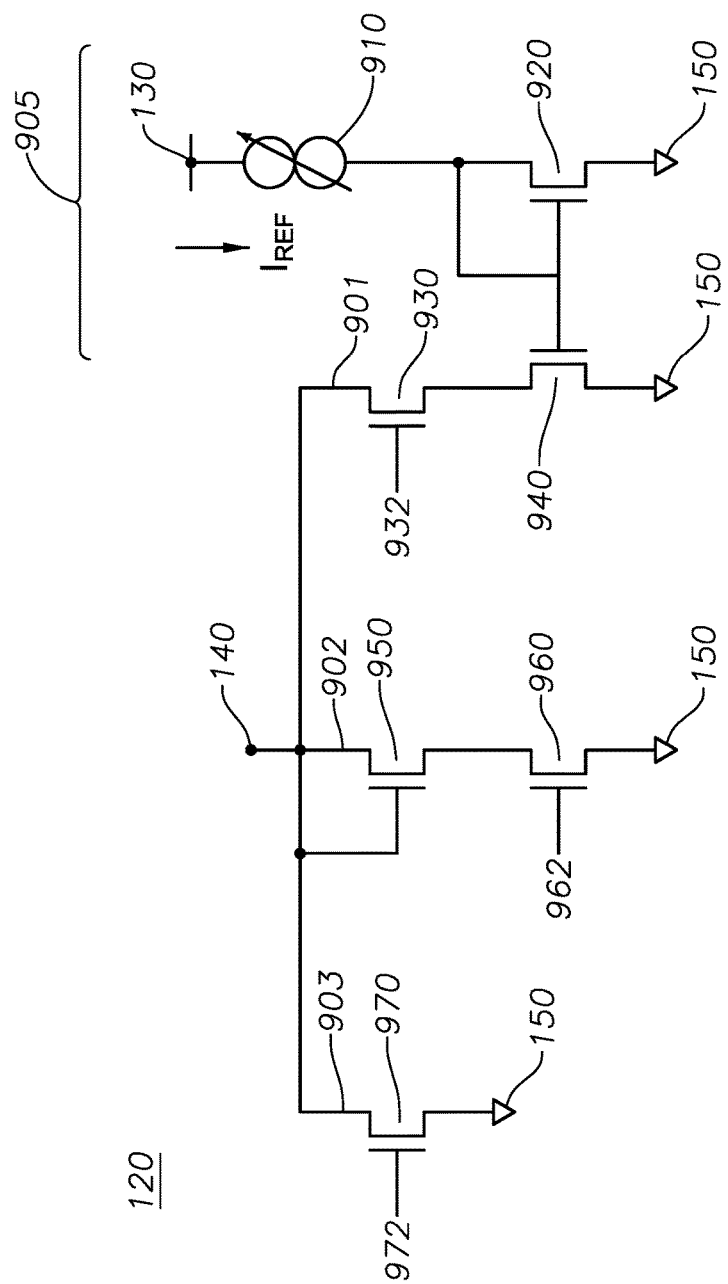
FIGS. 9-13 illustrate diagrams of the reference voltage circuitry in accordance with various implementations described herein.

In one such implementation, the at least one transistor device may have its gate receive a controllable voltage, where the controllable voltage is varied based on a voltage-controlled current source. The voltage-controlled current source may be a digitally controlled current source and/or any other implementation known to those skilled in the art. For example, FIG. 9 illustrates a diagram of the reference voltage circuitry 120 in accordance with various implementations described herein. As shown, a digitally controlled current source 910 may be used to vary a controllable voltage applied to a gate of NMOS transistor 940. In particular, the reference voltage circuitry 120 may include legs 901, 902, and 903, where only one leg may be enabled at a time. The leg 901 may be enabled by a switch 930 and enable signal 932, where the switch 930 and the enable signal 932 may function similarly to the switch and enable signal of the active mode circuitry 210, described above with respect to FIG. 2.

As shown, the leg 901 may include a current mirror circuit 905. In particular, the NMOS transistor 940 may be coupled in series with the switch 930. The NMOS transistor 940 may have its gate coupled to a gate of an NMOS diode 920. The NMOS diode 920 may have its source coupled to the negative voltage supply node 150 and a drain coupled to a digitally controlled current source 910. The digitally controlled current source 910 may be a digital-to-analog converter (DAC) programmable current source or any other implementation known to those in the art, and may produce a reference current $I_{REF}$. The digitally controlled current source 910 may also be coupled to the positive supply voltage node 130.

Via the current mirror circuit 905, the digitally controlled current source 910 may produce a voltage via the NMOS diode 920, where the voltage may be applied to the gate of NMOS transistor 940. As such, varying the digitally controlled current source 910 may also vary a controllable voltage applied to the gate of NMOS transistor 940. As explained above, varying the controllable voltage applied to the gate of NMOS transistor 940 may vary the retention voltage supplied to the functional circuitry 110. Further, as shown, the current mirror circuit 905 may be configured such that the reference current $I_{REF}$ produced by the current source 910 is substantially equal to the current produced across the NMOS transistor 940. In such an implementation, the digitally controlled current source 960 can be varied to change the reference current $I_{REF}$, which can control a leakage current across the reference voltage node 140. By minimizing the leakage current, the retention voltage supplied to the functional circuitry 110 may be made increased and/or stabilized.

The reference voltage circuitry 120 may also include legs 902 and 903. As shown, leg 902 may include an NMOS diode 950 coupled in series with the switch 960, where the switch 960 is enabled by signal 962. The switch 960 and the signal 962 may function similarly to the switch and enable signal of the active mode circuitry 210, described above with respect to FIG. 2. With leg 902 enabled, the NMOS diode 950 may produce a different reference voltage at the node 140 than the circuitry of leg 901 when enabled. As such, the circuitries of legs 901 and 902 may lead to different retention voltages being supplied to the functional circuitry 110. In some implementations, leg 902 may be optional. Other circuitries for leg 902 as known to those skilled in the art may be used, as well. The circuitry of leg 903 may be similar to the active mode circuitry 210 of FIG. 2, and may include a NMOS transistor 970 and enable signal 972. When the NMOS transistor 970 receives a high enable signal 972, the NMOS transistor 970 may turn on and allow the reference voltage at the node 140 to be substantially equal to $V_{SS}$, and thus place the functional circuitry 110 into its active mode.

In another implementation, the at least one transistor device may have its gate receive a controllable voltage, where the controllable voltage is varied based on a variable voltage source. The variable voltage source may be a voltage regulator and/or any other implementation known to those skilled in the art.

Figure 10:
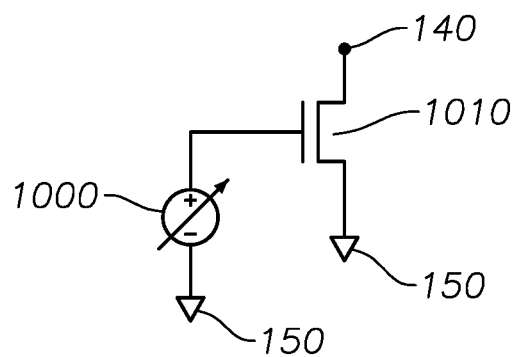

For example, FIG. 10 illustrates a diagram of the reference voltage circuitry 120 in accordance with various implementations described herein. As shown, the circuitry 120 may include a single NMOS transistor 1010, the transistor 1010 having its drain coupled to the reference voltage node 140 and its source coupled to the negative supply voltage node 150. Its gate may also be coupled to a voltage regulator 1000, where the voltage regulator 1000 may vary the amount of controllable voltage applied to the gate. As such, the impedance of the NMOS transistor 1010 may be varied. By varying the transistor impedance, the reference voltage applied to the reference voltage node 140 may be varied, as well. In one scenario, the controllable voltage may be varied such that the transistor has relatively low impedance, thereby allowing zero or a substantially small amount of voltage drop to be produced across the NMOS transistor 1010. In such an implementation, the functional circuitry 110 may be placed in its active mode of operation. In another scenario, the controllable voltage may be varied such that the NMOS transistor 1010 has relatively high impedance, thereby producing a larger voltage drop across the NMOS transistor 1010. In such an implementation, the functional circuitry 110 may be placed in its data retention mode of operation.

Figure 11:
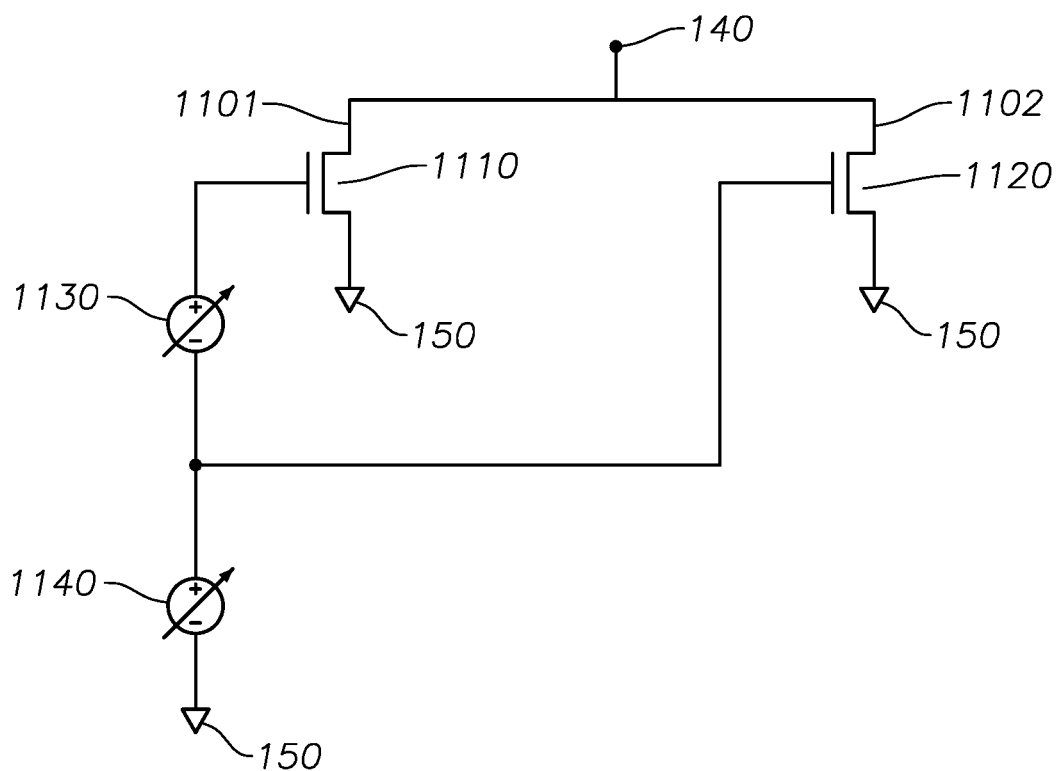

In another example, FIG. 11 illustrates a diagram of the reference voltage circuitry 120 in accordance with various implementations described herein. The reference voltage circuitry 120 may include legs 1101 and 1102, where one leg or both legs may be enabled at a time. The leg 1101 may include an NMOS transistor 1110 with its drain coupled to the reference voltage node 140 and its source coupled to the negative supply voltage node 150. Its gate may also be coupled to a positive terminal of a voltage regulator 1130, where the voltage regulator 1130 may vary the amount of voltage applied to the gate. As such, the impedance of the transistor 1110 may be varied. By varying the transistor impedance, the reference voltage applied to the reference voltage node 140 may be varied, as explained above.

The leg 1102 may include an NMOS transistor 1120 with its drain coupled to the reference voltage node 140 and its source coupled to the negative supply voltage node 150. Its gate may also be coupled to a negative terminal of the voltage regulator 1130 and a positive terminal of a voltage regulator 1140. A negative terminal of the voltage regulator 1140 may also be coupled to the negative supply voltage node 150. As such, the voltage regulator 1130 and the voltage regulator 1140 may vary the amount of voltage applied to the gate of the NMOS transistor 1120. Accordingly, the impedance of the transistor 1120 may be varied. By varying the impedances of the NMOS transistors 1110 and 1120, the reference voltage applied to the reference voltage node 140 may be varied, which may lead to different retention voltages being supplied to the functional circuitry 110 and may affect whether the functional circuitry 110 is placed in an active mode or a data retention mode, as explained above. In another implementation, the sizes of the NMOS transistors 1110 and 1120 may differ from one another, which may lead to different impedances and voltages drops being produced across each transistor. In a further implementation, both legs 1101 and 1102 may be enabled, such that both the NMOS transistors 1110 and 1120 may be coupled in parallel, and both voltage regulators 1130 and 1140 may vary the retention voltages being supplied to the functional circuitry 110.

Figure 12:
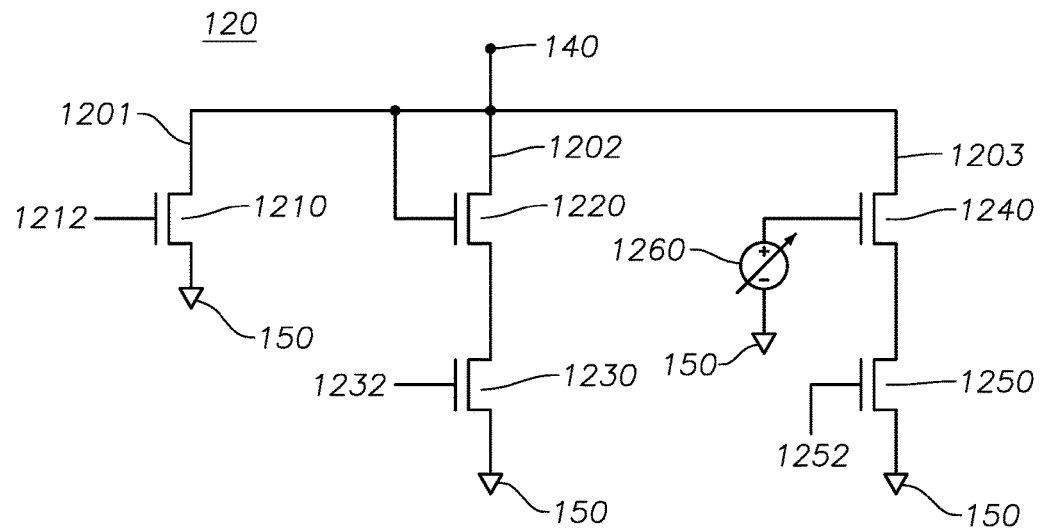

In another example, FIG. 12 illustrates a diagram of the reference voltage circuitry 120 in accordance with various implementations described herein. The reference voltage circuitry 120 may include legs 1201, 1202, and 1203, where one leg may be enabled at a time. The leg 1203 may be enabled by a switch 1250 and enable signal 1252, where the switch 1250 and the enable signal 1252 may function similarly to the switch and enable signal of the active mode circuitry 210, described above with respect to FIG. 2. As shown, the leg 1203 may include an NMOS transistor 1240 coupled in series with the switch 1250. In the example shown, a source terminal of the NMOS transistor 1240 is coupled to a drain terminal of the switch 1250, though other configurations for coupling the devices in series may be used instead. The gate of the NMOS transistor 1240 may be coupled to a voltage regulator 1260, where the voltage regulator 1260 may vary the amount of voltage applied to the gate. Accordingly, the impedance of the transistor 1240 may be varied when the leg 1203 is enabled. By varying the transistor impedance, the reference voltage applied to the reference voltage node 140 may be varied, which may lead to different retention voltages being supplied to the functional circuitry 110 and may affect whether the functional circuitry 110 is placed in a data retention mode, as explained above.

The reference voltage circuitry 120 may also include legs 1201 and 1202. As shown, leg 1202 may include an NMOS diode 1220 coupled in series with the switch 1230, where the switch 1230 is enabled by signal 1232. In the example shown, a source terminal of the NMOS diode 1220 is coupled to a drain terminal of the switch 1230, though other configurations for coupling the devices in series may be used instead. The switch 1230 and the signal 1232 may function similarly to the switch and enable signal of the active mode circuitry 210, described above with respect to FIG. 2. With leg 1202 enabled, the NMOS diode 1220 may produce a different reference voltage at the node 140 than the circuitry of leg 1203 when enabled. As such, the circuitries of legs 1202 and 1203 may lead to different retention voltages being supplied to the functional circuitry 110. In some implementations, leg 1202 may be optional. Other circuitries for leg 1202 as known to those skilled in the art may be used, as well. The circuitry of leg 1201 may be similar to the active mode circuitry 210 of FIG. 2, and may include a NMOS transistor 1210 and enable signal 1212. When the NMOS transistor 1210 receives a high enable signal 1212, the NMOS transistor 1210 may turn on and allow the reference voltage at the node 140 to be substantially equal to $V_{SS}$, and thus place the functional circuitry 110 into its active mode.

Figure 13:
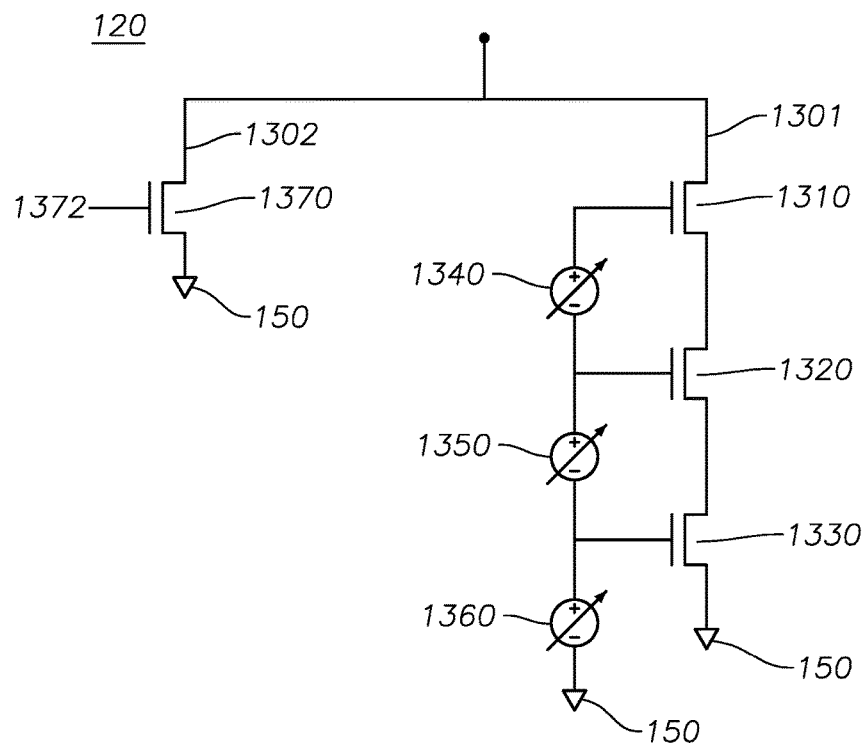

In another example, FIG. 13 illustrates a diagram of the reference voltage circuitry 120 in accordance with various implementations described herein. The reference voltage circuitry 120 may include legs 1301 and 1302, where one leg or both legs may be enabled at a time. The legs 1301 and 1302 may each have one end coupled to the reference voltage node 140 and another end coupled to the negative supply voltage node 150. As shown, the leg 1301 may include three NMOS transistors 1310, 1320, and 1330 coupled in series. In particular, a source terminal of the NMOS transistor 1310 may be coupled to a drain terminal of the NMOS transistor 1320, and a source terminal of the NMOS transistor 1320 may be coupled to a drain terminal of the NMOS transistor 1330.

The NMOS transistor 1310 may have its gate coupled to a positive terminal of a voltage regulator 1340, where the voltage regulator 1340 may vary the amount of voltage applied to the gate of the transistor 1310. As such, the impedance of the transistor 1310 may be varied by the voltage regulator 1340.

Similarly, the NMOS transistor 1320 may have its gate coupled to a negative terminal of the voltage regulator 1340 and a positive terminal of a voltage regulator 1350. As such, the voltage regulator 1340 and the voltage regulator 1350 may vary the amount of voltage applied to the gate of the transistor 1320. In addition, the NMOS transistor 1330 may have its gate coupled to a negative terminal of the voltage regulator 1350 and a positive terminal of a voltage regulator 1360. A negative terminal of the voltage regulator 1360 may also be coupled to the negative supply voltage node 150. As such, the voltage regulator 1350 and the voltage regulator 1360 may vary the amount of voltage applied to the gate of the transistor 1330.

By varying the transistor impedances using the voltage regulators, the reference voltage applied to the reference voltage node 140 via leg 1301 may be varied, which may lead to different retention voltages being supplied to the functional circuitry 110 and may affect whether the functional circuitry 110 is placed in a data retention mode, as explained above. The reference voltage circuitry 120 may also include leg 1302. The circuitry of leg 1302 may be similar to the active mode circuitry 210 of FIG. 2, and may include a NMOS transistor 1370 and enable signal 1372. When the NMOS transistor 1370 receives a high enable signal 1372, the NMOS transistor 1370 may turn on and allow the reference voltage at the node 140 to be substantially equal to $V_{SS}$, and thus place the functional circuitry 110 into its active mode.

In sum, various implementations for the reference voltage circuitry 120 may be used, including the implementations described above with respect to FIGS. 1-13.

As noted above, the functional circuitry 110 may be a memory device, a retention latch, a retention flop, and/or any other implementation known to those in the art. In particular, the memory device may include one or more memory arrays arranged into memory cells and the associated circuitry to write data to the memory cells and read data from the memory cells. In one implementation, the memory device may include one or more SRAM arrays, where memory cells of the SRAM arrays are configured in a 6T configuration, 8T configuration, or any other configuration known to those skilled in the art. In such an implementation, respective memory cells may include at least two PMOS transistors and at least two NMOS transistors, as known to those skilled in the art. In a further implementation, the reference voltage circuitry 120 may provide various reference voltages for one or more memory cells of one or more memory arrays. For example, the reference voltage circuitry 120 may provide various reference voltages for a memory column of a memory array, where the memory column includes multiple memory cells.

In another implementation, a plurality of the reference voltage circuitries 120 may be coupled to the functional circuitry 110. For example, the functional circuitry 110 may be a memory device having a memory array. In such an example, each memory column of the memory array may be coupled to a different instance of the reference voltage circuitry 120. Other examples known to those skilled in the art may be used, as well. In another such implementation, multiples instances of the reference voltage circuitries 120 may be coupled to the same functional circuitry 110, such as the same memory column. As such, one or more instances of the reference voltage circuitry 120 may be enabled in order to provide various reference voltages to the functional circuitry 110.

In another implementation, where functional circuitry 110 is a memory device having one or more memory arrays and associated input/output circuitry, each instance of the plurality of the reference voltage circuitries 120 may be activated using the different enable signals mentioned above, by external control pins or other implementations known to those in the art. Further, the reference voltage circuitries 120 may be modular and repeated. Conversely, the reference voltage circuitries 120 may each be different, such as by the use of different circuitries, different sized transistor devices, and/or the like. Using such an implementation, such as the controls pins and/or enable signals, a retention voltage may be set for the memory device. For example, a minimum retention voltage may be set for the entire memory device. In another example, the controls pins and/or enable signals may be used to apply different retention voltages for different parts of the memory device (e.g., memory columns), such as by applying a higher retention voltage to a defective part of the memory device than the retention voltages applied to other parts of the memory device. In yet another example, the control pins and/or enable signals may be used to change the retention voltage applied to the memory device during operation.

As shown in the implementations discussed above, the reference voltage circuitry 120 may be disposed between the functional circuitry 110 and the negative supply voltage node 150 (i.e., $V_{SS}$). However, in other implementations, the reference voltage circuitry 120 may be disposed between the functional circuitry 110 and the positive supply voltage node 130 ($V_{DD}$). Each of the above implementations may altered as known by those in the art to use such a reference voltage circuitry to generate various retention voltages between the positive supply voltage node 130 and the functional circuitry 110. In yet another implementation, at least one PMOS header and at least one NMOS footer may be used in conjunction with the functional circuitry 110 and the reference voltage circuitry 120.

In an implementation where the functional circuitry 110 is a memory device having a memory array, the word-line drivers of the memory device may be coupled to the negative supply voltage node 150 (i.e., $V_{SS}$), where the $V_{SS}$ may be a ground voltage. In an implementation where the reference voltage circuitry 120 may be disposed between the memory array and the negative supply voltage node 150, the reference voltage supplied at the node 140 to the array may be greater than $V_{SS}$. In such a case where the reference voltage to the memory array is greater than the $V_{SS}$ supplied to the word-line drivers, current leakage may be reduced in the memory cells of the memory array. Further, the bit-lines of the memory device may be precharged to a particular voltage (e.g., VDDPE). In such a case where the reference voltage to the memory array is greater than the $V_{SS}$ supplied to the word-line drivers, current leakage may be reduced in the bit-line precharge devices.

In another implementation, the transistor devices and the diode devices used in the reference voltage circuitry 120 may be of any sizing, have any range of threshold voltages, and include any number of long-channel devices, as is understood by those skilled in the art. In addition, one or more of the reference voltage circuitries 120 discussed above are mentioned as being capable of producing various reference voltages that may lead to different retention voltages being supplied to the functional circuitry 110. In one implementation, and as understood by those skilled in the art, these reference voltage circuitries 120 may also produce various reference voltages that may lead to the functional circuitry 110 being placed in the active mode. In such an implementation, and where the reference voltage circuitry 120 may be disposed between the memory array and the negative supply voltage node 150, these reference voltages at the node 140 may also be used for when the functional circuitry is operating in its active mode. For memory devices, these reference voltages may improve the write-ability of memory cells and may improve the access disturb margin, as well.

As explained above a reference voltage circuitry may be implemented using various circuitries in order to produce a plurality of reference voltages for a functional circuitry. As noted above, these reference voltages may be used to place the functional circuitry in an active mode or a data retention mode. Furthermore, the reference voltage circuitry may be able to produce various reference voltages that may lead to different retention voltages being supplied to the functional circuitry. As noted above, in order to minimize current leakage, the reference voltage circuitry may produce the reference voltage that produces the lowest retention voltage for the functional circuitry. By minimizing the current leakage, a retention voltage supplied to the functional circuitry may be reduced, which may lead to a decrease in data retention failures in the functional circuitry.

Further, the ability to supply different retention voltages to the functional circuitry may allow for a dynamic adjustment of the functional circuitry using dynamic voltage scaling. For example, when the functional circuitry is operating at over-drive voltage, a higher reference voltage may be supplied by the reference voltage circuitry. When the functional circuitry is operating at nominal voltage, a lower reference voltage may be supplied by the reference voltage circuitry. Further, when the functional circuitry is operating at under-drive voltage, a lowest reference voltage may be supplied by the reference voltage circuitry.

The description provided herein may be directed to specific implementations. It should be understood that the discussion provided herein is provided for the purpose of enabling a person with ordinary skill in the art to make and use any subject matter defined herein by the subject matter of the claims.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve a developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Reference has been made in detail to various implementations, examples of which are illustrated in the accompanying drawings and figures. In the detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An integrated circuit, comprising:
   functional circuitry configured to store one or more data bits; and
   retention mode circuitry coupled to the functional circuitry and configured to provide a plurality of retention voltages to the functional circuitry, wherein the retention mode circuitry comprises:
     a first circuitry configured to provide a first retention voltage to the functional circuitry, wherein the first circuitry comprises:
       a first diode device; and
       a first transistor device, a second diode device, or combinations thereof; and
     a second circuitry configured to provide a second retention voltage to the functional circuitry, wherein the second circuitry comprises a plurality of second transistor devices;
   wherein the functional circuitry is configured to be held in a data retention mode when the first retention voltage or the second retention voltage is provided to the functional circuitry.

2. The integrated circuit of claim 1, wherein:
   the functional circuitry comprises a memory device, a retention latch, a retention flop, or combinations thereof; and the functional circuitry in the data retention mode is configured to maintain the storage of the one or more data bits if at least a minimum voltage is provided to the functional circuitry, and wherein the first retention voltage and the second retention voltage are each greater than or equal to the minimum voltage.

3. The integrated circuit of claim 1, wherein the functional circuitry is coupled between a positive voltage supply node and a reference voltage node, and wherein the retention mode circuitry is coupled between the reference voltage node and a negative voltage supply node.

4. The integrated circuit of claim 3, further comprising reference voltage circuitry configured to produce a reference voltage at the reference voltage node, wherein the reference voltage circuitry comprises:
the retention mode circuitry; and
active mode circuitry configured to place the functional circuitry in an active mode when the active mode circuitry is enabled, wherein the functional circuitry in the active mode is configured to allow a read or write access to the functional circuitry.

5. The integrated circuit of claim 4, wherein the first retention voltage provided to the functional circuitry is based on a first reference voltage produced by the first circuitry at the reference voltage node, and wherein the second retention voltage provided to the functional circuitry is based on a second reference voltage produced by the second circuitry at the reference voltage node.

6. The integrated circuit of claim 5, wherein the first reference voltage is greater than the second reference voltage, and wherein the first retention voltage is less than the second retention voltage.

7. The integrated circuit of claim 1, wherein the first retention voltage is less than the second retention voltage.

8. The integrated circuit of claim 1, wherein the first circuitry is coupled to a first leg and the second circuitry is coupled to a second leg, and wherein one of the first leg or the second leg is enabled to hold the functional circuitry in the data retention mode.

9. The integrated circuit of claim 1, wherein the first circuitry or the second circuitry is configured to be enabled dynamically in response to one or more environmental conditions.

10. The integrated circuit of claim 1, wherein the first circuitry comprises the first diode device, the second diode device, and the first transistor device coupled in series, wherein the first diode device is an NMOS diode, the second diode device is an NMOS diode, and the first transistor device is a PMOS transistor.

11. The integrated circuit of claim 1, wherein the first circuitry comprises the first diode device and the second diode device coupled in parallel, wherein the first diode device is a NMOS diode and the second diode device is a PMOS diode.

12. The integrated circuit of claim 1, wherein the first circuitry comprises the first circuitry comprises the first diode device, the transistor device, and the second diode device coupled in series, and wherein a switch device is configured to bypass the second diode device, wherein the first diode device is a NMOS diode, the second diode device is a NMOS diode, the switch device is a NMOS transistor, and the first transistor device is a NMOS transistor having a gate configured to receive a controllable voltage.

13. The integrated circuit of claim 1, wherein the plurality of second transistor devices comprises a plurality of n-type transistor devices coupled in series, and wherein no diode devices are included in the second circuitry.

14. An integrated circuit, comprising:
functional circuitry coupled between a positive voltage supply node and a reference voltage node and configured to store one or more data bits; and
reference voltage circuitry coupled between the reference voltage node and a negative voltage supply node and configured to provide one or more retention voltages to the functional circuitry, wherein the reference voltage circuitry comprises:
at least a first n-type transistor device having a gate configured to receive a first controllable voltage, and wherein the one or more retention voltages is based on varying the first controllable voltage;
wherein the functional circuitry is configured to be held in a data retention mode when the one or more retention voltages is provided to the functional circuitry.

15. The integrated circuit of claim 14, wherein the one or more retention voltages provided to the functional circuitry is based on one or more reference voltages produced by the reference voltage circuitry at the reference voltage node, and wherein the one or more reference voltages is produced based on varying the first controllable voltage.

16. The integrated circuit of claim 14, wherein the reference voltage circuitry comprises a current mirror circuit having a voltage-controlled current source, wherein the current mirror circuit includes the first n-type transistor device, and wherein the first controllable voltage received by the gate is varied based on the voltage-controlled current source.

17. The integrated circuit of claim 14, wherein the first controllable voltage is varied based on a first voltage regulator coupled to the gate of the first n-type transistor device.

18. The integrated circuit of claim 17, wherein the reference voltage circuitry comprises the first n-type transistor device coupled with a second n-type transistor device having a gate configured to receive a second controllable voltage, wherein the second controllable voltage is varied based on a second voltage regulator coupled to the gate of the second n-type transistor device, and wherein the one or more retention voltages is based on varying the first controllable voltage and varying the second controllable voltage.

19. An integrated circuit, comprising:
functional circuitry configured to store one or more data bits; and
retention mode circuitry coupled to the functional circuitry and configured to provide a plurality of retention voltages to the functional circuitry, wherein the retention mode circuitry comprises:
a first circuitry configured to provide a first retention voltage to the functional circuitry, wherein the first circuitry comprises a diode device; and
a second circuitry configured to provide a second retention voltage to the functional circuitry, wherein the second circuitry comprises a plurality of transistor devices;
wherein the functional circuitry is configured to be held in a data retention mode when the first retention voltage or the second retention voltage is provided to the functional circuitry.

20. The integrated circuit of claim 19, wherein the diode device is an NMOS diode, wherein the plurality of transistor devices comprises a plurality of NMOS transistor devices coupled in series.

* * * * *